(12) United States Patent
Jeong et al.

(10) Patent No.: US 12,442,853 B2
(45) Date of Patent: Oct. 14, 2025

(54) TEST AID UNITS

(71) Applicants: SK hynix Inc., Icheon (KR); SEOUL NATIONAL UNIVERSITY R&DB FOUNDATION, Seoul (KR)

(72) Inventors: Deog Kyoon Jeong, Seoul (KR); Chan Ho Kye, Seoul (KR); Ji Hee Kim, Seoul (KR)

(73) Assignees: SK hynix Inc., Icheon (KR); Seoul National University R&DB Foundation, Seoul (KR)

(*) Notice: Subject to any disclaimer, the term of this patent is extended or adjusted under 35 U.S.C. 154(b) by 272 days.

(21) Appl. No.: 18/349,069

(22) Filed: Jul. 7, 2023

(65) Prior Publication Data
US 2024/0329116 A1    Oct. 3, 2024

(30) Foreign Application Priority Data
Mar. 27, 2023  (KR) .................. 10-2023-0039947

(51) Int. Cl.
| | | |
|---|---|---|
| *G01R 31/28* | (2006.01) | |
| *G01R 31/317* | (2006.01) | |
| *H03K 3/037* | (2006.01) | |
| *H03K 5/00* | (2006.01) | |
| *H03K 19/20* | (2006.01) | |

(52) U.S. Cl.
CPC ... *G01R 31/2851* (2013.01); *G01R 31/31727* (2013.01); *H03K 3/037* (2013.01); *H03K 5/00006* (2013.01); *H03K 19/20* (2013.01)

(58) Field of Classification Search
CPC .............. G01R 31/2851; G01R 31/317; G01R 31/31922; G01R 31/31727; H03K 3/037; H03K 5/00006; H03K 21/00
See application file for complete search history.

(56) References Cited

U.S. PATENT DOCUMENTS

| | | | | |
|---|---|---|---|---|
| 6,374,392 | B1* | 4/2002 | Ochiai | G01R 31/31922 714/744 |
| 7,157,953 | B1* | 1/2007 | Nguyen | H03M 9/00 327/299 |
| 11,437,805 | B2* | 9/2022 | Thompson, Jr. | G08B 21/185 |
| 2004/0151506 | A1* | 8/2004 | Shiramizu | H03K 5/00006 398/140 |
| 2005/0246603 | A1* | 11/2005 | Rottacker | G01R 31/31905 714/742 |
| 2005/0285640 | A1* | 12/2005 | Nakamura | G01R 31/31922 327/145 |
| 2007/0247960 | A1 | 10/2007 | Minzoni et al. | |

OTHER PUBLICATIONS

Chan-Ho Kye et al., "A 10Gb/s/pin DQS and WCK Built-Out Tester for LPDDR5 DRAM Test", 2022 IEEE Asian Solid-State Circuits Conference (A-SSCC), Nov. 6-9, 2022, Taipei, Taiwan.

* cited by examiner

*Primary Examiner* — Christopher E Mahoney

(57) ABSTRACT

Disclosed is a test aid unit that is installed between automatic test equipment (ATE) and a device under test (DUT), generates a test data signal according to a data processing and transmission/reception rate of the DUT in response to a control signal transmitted from the ATE, transmits the test data signal to the DUT, self-tests a test result signal transmitted from the DUT, and transmits the test result to the ATE. The test aid unit includes a clock signal divider, an integrated digital logic unit, a transmitter, and a receiver.

17 Claims, 11 Drawing Sheets

TEST AID UNITS

CROSS-REFERENCE TO RELATED APPLICATION

This application claims priority under 35 U.S.C. § 119 to Korean Patent Application No. 10-2023-0039947 filed on Mar. 27, 2023, which is incorporated herein by reference in its entirety.

BACKGROUND

1. Technical Field

Embodiments of the present disclosure relate to a test aid unit that can be installed and used between automatic test equipment (ATE) and a device under test (DUT), and more particularly, to a test aid unit that can test electrical characteristics of a corresponding DUT even though an ATE operates at a processing rate that is lower than a data processing rate of the DUT.

2. Discussion of the Related Art

Recently, the specifications of electronic products are getting more complicated, and data processing rates of circuits implemented in chips that perform functions of the electronic products are gradually increasing. A process of testing electrical characteristics of circuits constituting a semiconductor chip is performed in a manufacturing stage, but in a mass production stage, it is necessary to perform this test before determining whether to ship the semiconductor chip. In each test step, appropriate automatic test equipment (ATE) is selected according to electrical characteristics or specifications of a chip to be tested, and a test process is performed according to pre-determined test items.

Equipment for testing electrical characteristics of a semiconductor device that processes or transmits/receives data at a processing rate of gigabit per second (Gb/s) needs to process data at such a processing rate or a higher rate in order to completely test the electrical characteristics of the semiconductor device.

In general, manufacturing test equipment with a high data processing rate is not only technically difficult, but also requires significant manufacturing cost. When characteristics of a product are tested using expensive test equipment, the unit price of the product increases.

What is more problematic is when there is no test equipment with specifications capable of testing semiconductor products. In this case, it is necessary to wait until the test equipment is manufactured. However, since the manufacturing of the test equipment is handled by an equipment manufacturer, not a semiconductor manufacturer, the semiconductor manufacturer is not able to control the manufacturing and a manufacturing schedule of the test equipment.

For example, a data transmission/reception rate of a low-power double data rate (DDR) dynamic random access memory (DRAM) is expected to reach 8.5 Gb/s, but existing test equipment has a data processing rate limited to 8 Gb/s.

In a DRAM with DDR5 or LPDDR5 specifications having a data processing rate of 8.5 Gb/s, data (DQ) transmission/reception characteristics can be tested using design for testability (DFT) embodied in a semiconductor chip, but there is a problem in that the DFT is not applicable to the test of a data strobe signal DQS or a data clock signal WCK.

SUMMARY

Various embodiments are directed to providing a test aid unit that is installed between automatic test equipment (ATE) and a device under test (DUT), generates a test data signal depending on a data processing and transmission/reception rate of the DUT in response to a control signal transmitted from the ATE, transmits the test data signal to the DUT, examines a test result signal transmitted from the DUT, and transmits a test result to the ATE.

Technical problems to be achieved in the present disclosure are not limited to the aforementioned technical problems and the other unmentioned technical problems will be clearly understood by those skilled in the art from the following description.

A test aid unit according to the present disclosure includes a clock signal divider, an integrated digital logic circuit, a transmitter, and a receiver.

The clock signal divider generates a ½ divided clock signal, a ¼ divided clock signal, and a ⅛ divided clock signal, which are synchronized with a reference clock signal, by using a plurality of reset signals, the reference clock signal, and a reference clock bar signal having a phase opposite to that of the reference clock signal. The integrated digital logic circuit operates in response to a plurality of test control signals received from automatic test equipment, and generates a driver enable signal, a test data signal, and a check result signal. The transmitter converts a transmission rate of the test data signal in parallel form into a transmission rate corresponding to a data processing rate of a device under test in response to the reference clock signal, the ½ divided clock signal, the ¼ divided clock signal, and the ⅛ divided clock signal, and transmits the converted signal to the device under test. The receiver converts a received data signal in serial form received from the device under test into parallel data in response to the reference clock signal, the ½ divided clock signal, the ¼ divided clock signal, and the ⅛ divided clock signal, and transmits the parallel data to the integrated digital logic unit. Cycles of the ½ divided clock signal, the ¼ divided clock signal, and the ⅛ divided clock signal are ½ times, ¼ times, and ⅛ times a cycle of the reference clock signal.

The test aid unit according to the present disclosure described above can test electrical characteristics of the device under test by using the automatic test equipment having a lower signal processing rate than the device under test, and minimize a test error due to a phase difference between channels by matching phases of internal clocks.

Effects achievable in the disclosure are not limited to the aforementioned effects and the other unmentioned effects will be clearly understood by those skilled in the art from the following description.

DETAILED DESCRIPTION

Figure 1:
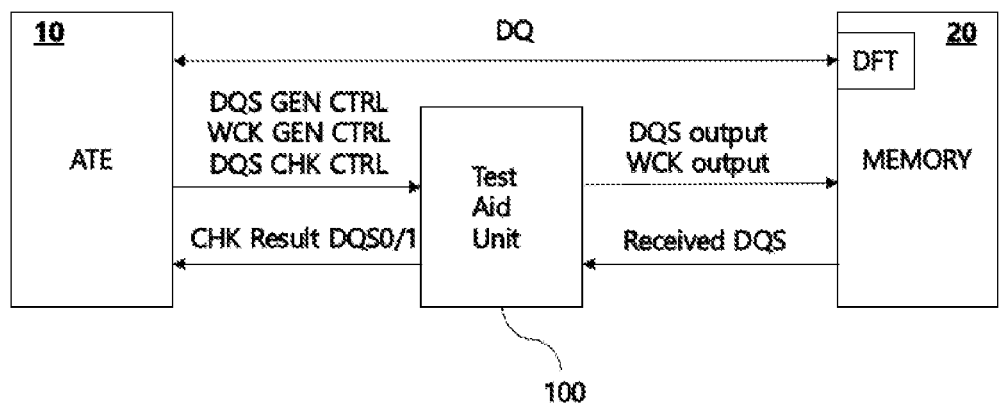
FIG. 1 illustrates a test system according to an embodiment of the present disclosure.

In order to fully understand the present disclosure, advantages in operation of the present disclosure, and objects achieved by carrying out the present disclosure, the accompanying drawings for explaining exemplary examples of the present disclosure and the contents described with reference to the accompanying drawings need to be referred to.

Hereinafter, preferred embodiments of the present disclosure are described in detail with reference to the accompanying drawings. The same reference numerals among the reference numerals in each drawing indicate the same members.

FIG. 1 illustrates a test system including a test aid unit according to an embodiment of the present disclosure. Referring to FIG. 1, a data signal DQ is directly transmitted and received between automatic test equipment (ATE) 10 and a device under test (DUT) 20 without passing through a test aid unit (TAU) 100, but other signals are transmitted and received therebetween through the test aid unit 100.

Figure 2:
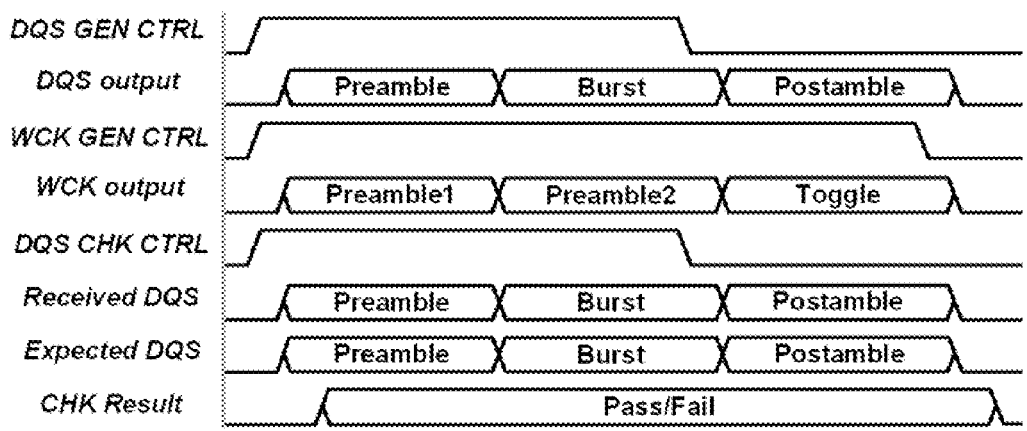
FIG. 2 illustrates several signals used in a test aid unit according to an embodiment of the present disclosure.

For convenience of description, it is assumed that the DUT 20 is a memory chip MEMORY. FIG. 2 illustrates several signals used in the test aid unit 100 according to an embodiment of the present disclosure.

Referring to FIGS. 1 and 2, the TAU100 receives a plurality of test control signals from the ATE 10. More specifically, the TAU 100 generates a data strobe signal "DQS output" and a data clock signal "WCK output" in response to a data strobe signal (DQS) generation control signal "DQS GEN CTRL" and a data clock signal (WCK) generation control signal "WCK GEN CTRL", respectively, received from the ATE 10, applies a serializer (not illustrated) to the data strobe signal "DQS output" and the data clock signal "WCK output" to increase a data transmission rate, and then transmits the data strobe signal "DQS output" and the data clock signal "WCK output" to the DUT 20 at the increased data transmission rate.

The TAU 100 also applies a deserializer (not illustrated) to a received data strobe signal "Received DQS" received from the DUT 20 to reduce a data transmission rate of the received data strobe signal "Received DQS", and then transmits a check result signal "CHK Result DQS0/1" or "CHK Result", which is a result of comparing the received data strobe signal "Received DQS" with an expected data strobe signal "Expected DQS" stored in advance therein, to the ATE 10, in response to a DQS check control signal "DQS CHK CTRL" received from the ATE 10. The check result signal "CHK Result DQS0/1" illustrated in FIG. 1 and a signal "CHK Result" illustrated in FIG. 2 are the same signals. The "DQS" is an abbreviation indicating a data strobe signal, and the "WCK" is an abbreviation indicating a clock signal for data transmission. Hereinafter, double quotation marks (" ") assigned to signal names are omitted.

As will be described below, preferably, the data transmission rate increased by the serializer corresponds to a data transmission/reception (or processing) rate of the DUT 20, and the data transmission rate decreased by the deserializer corresponds to a data transmission/reception (or processing) rate of the ATE 10.

For example, assuming that the data transmission/reception rate of the ATE 10 is 5 Gb/s and the data transmission/reception rate of the DUT 20 is 10 Gb/s, the TAU 100 generates the data strobe signal DQS output and the data clock signal WCK output and transmits the data strobe signal DQS output and the data clock signal WCK output to the DUT 20 at a transmission rate of 10 Gb/s, and reduces a transmission rate of the received data strobe signal Received DQS received from the DUT 20 from 10 Gb/s to 5 Gb/s and transmits the received data strobe signal Received DQS to the ATE 10 at the transmission rate of 5 Gb/s.

Referring to FIG. 2, the data strobe signal DQS output generated by the TAU 100 may include a preamble signal Preamble, a burst signal Burst, and a postamble signal Postamble, and the data clock signal WCK output may include a first preamble signal Preamble1, a second preamble signal Preamble2, and a toggle signal Toggle. Each of the expected data strobe signal Expected DQS stored in advance in the TAU 100 and the received data strobe signal Received DQS received from the DUT 20 also includes a preamble signal Preamble, a burst signal Burst, and a postamble signal Postamble. Since detailed roles of these signals are well known to manufacturers or users of commercial DRAMs, descriptions thereof will be omitted.

Referring to FIG. 2, it can be seen that the data strobe signal DQS output and the data clock signal WCK output are not simple clocks. For example, the data strobe signal DQS output affects a data read or write operation of a DRAM according to a binary state of its preamble signal and a state of its trigger pulse, but toggles at the same frequency as a frequency of the data clock signal WCK output, through which burst data is transmitted, during a burst period.

The check result signal CHK Result includes information on whether the received data strobe signal Received DQS and the expected data strobe signal Expected DQS are identical to each other or not as a result of comparing them with each other. When they are identical to each other, the check result signal CHK Result has a "Pass" state. On the other hand, when they are not identical to each other, the check result signal CHK Result has a "Fail" state.

Figure 3:
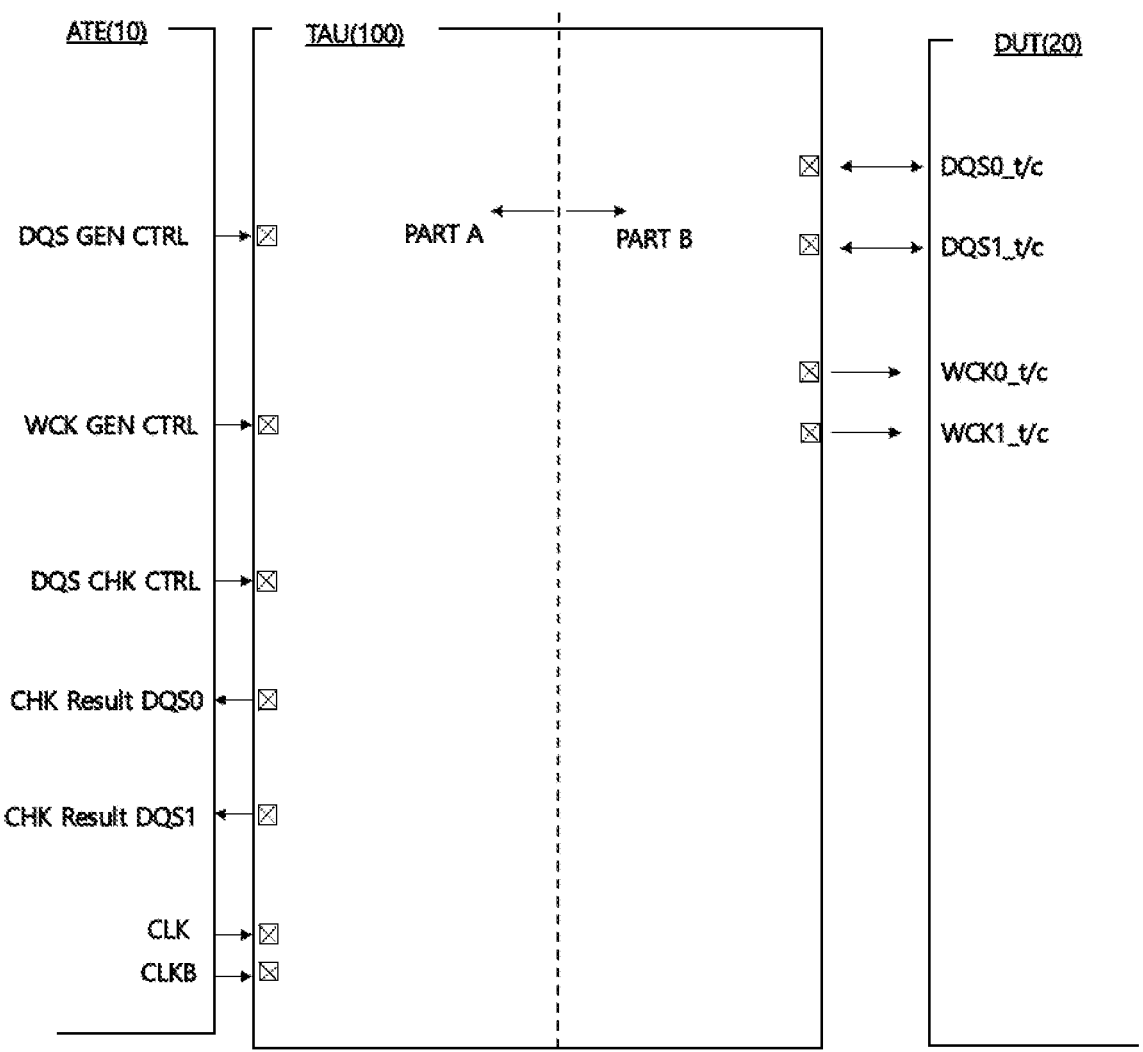
FIG. 3 illustrates a test aid unit according to an embodiment of the present disclosure.
Figure 4:
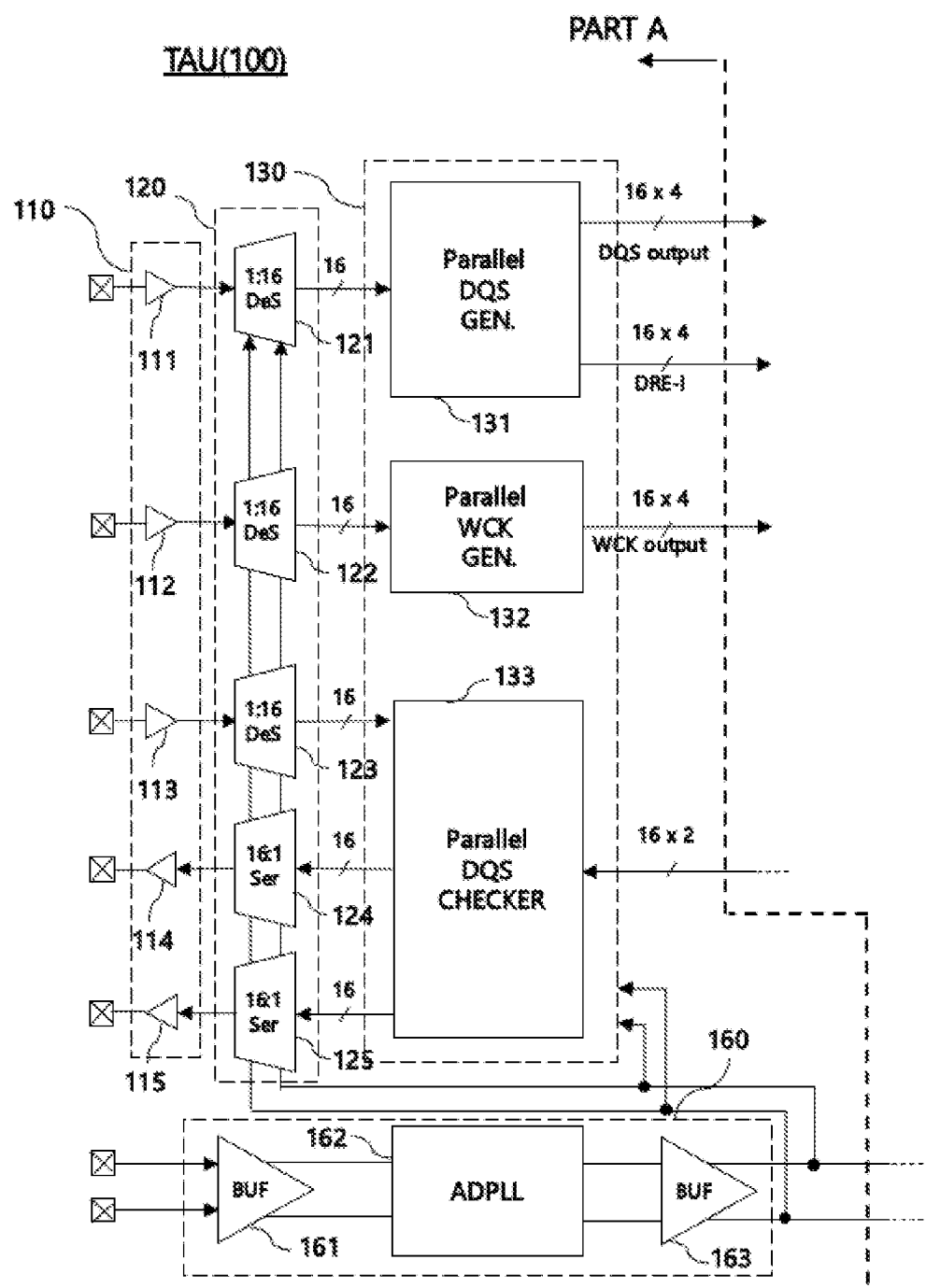
FIG. 4 illustrates a first part of the test aid unit of FIG. 3.
Figure 5:
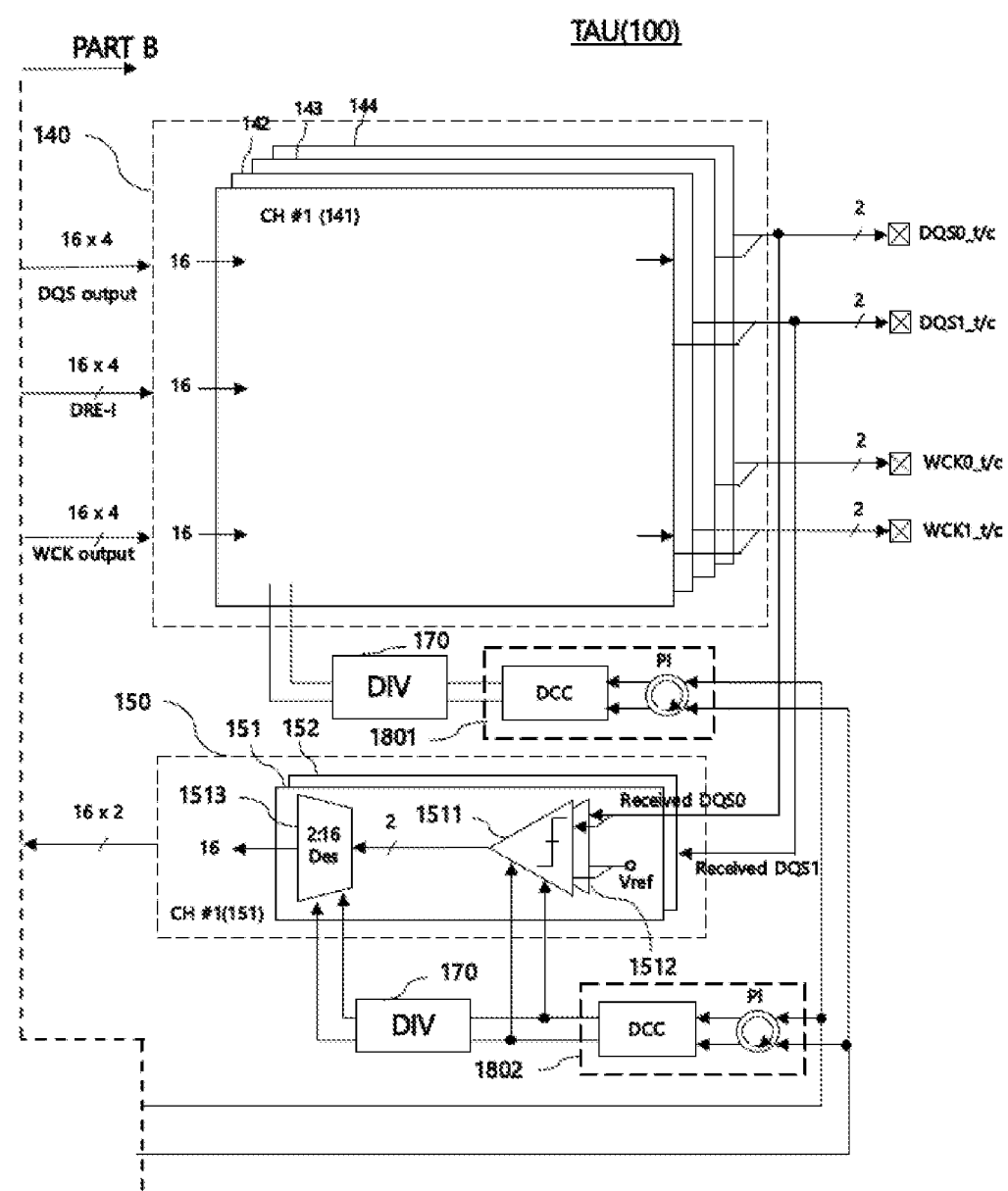
FIG. 5 illustrates a second part of the test aid unit of FIG. 3.

FIGS. 3 to 5 illustrate the TAU 100 of FIG. 1 according to an embodiment of the present disclosure.

Referring to FIGS. 3 to 5, the TAU 100 includes a buffer unit 110, a serial/deserial converter 120, an integrated digital logic unit 130, a multi-channel transmitter 140, a multi-channel receiver 150, a clock signal processing unit 160, first and second clock signal dividers (DIVs) 1701 and 1702, and first and second phase interpolators 1801 and 1802. For convenience of description, it is assumed that the multi-channel transmitter 140 has four channels and the multi-channel receiver 150 has two channels. For convenience of description, the multi-channel transmitter 140 may be simply referred to as a "transmitter" and the multi-channel receiver 150 to as a "receiver".

The buffer unit 110 includes a plurality of buffers 111 to 115, buffers three control signals DQS GEN CTRL, WCK GEN CTRL, and DQS CHK CTRL received from the ATE 10, transmits the buffered control signals to the serial/deserial converter 120, buffers first and second check result signals CHK Result DQS0 and CHK Result DQS1 output from the serial/deserial converter 120, and transmits the buffered check result signals to the ATE 10.

The serial/deserial converter 120 includes first to third deserializers (DeS) 121 to 123 and first and second serializers (Ser) 124 and 125.

In the following description, it is assumed that a data processing unit is 16 bits. Therefore, unless otherwise specified, a data processing unit of each of the first to third deserializers 121 to 123 and a data processing unit of each of the first and second serializers 124 and 125 are each 16 bits.

The first deserializer (1:16 DeS) 121 deserializes the DQS generation control signal DQS GEN CTRL, which is in serial form and output from the ATE 10, into a signal in parallel form, and transmits the deserialized signal to the integrated digital logic unit 130.

The second deserializer (1:16 DeS) 122 deserializes the WCK generation control signal WCK GEN CTRL, which is in serial form and output from the ATE 10, into a signal in parallel form, and transmits the deserialized signal to the integrated digital logic unit 130.

The third deserializer (1:16 DeS) 123 deserializes the DQS check control signal DQS CHK CTRL, which is in serial form and output from the ATE 10, into a signal in parallel form, and transmits the deserialized signal to the integrated digital logic unit 130.

The first serializer (16:1 Ser) 124 serializes the first check result signal CHK Result DQS0, which is in parallel form and received from the integrated digital logic unit 130, into a signal in serial form, and transmits the serialized signal to the ATE 10 via the buffer unit 110.

The second serializer (16:1 Ser) 125 serializes the second check result signal CHK Result DQS1, which is in parallel form and received from the integrated digital logic unit 130, into a signal in serial form, and transmits the serialized signal to the ATE 10 via the buffer unit 110.

The first to third deserializers 121 to 123 and the first and second serializers 124 and 125 included in the serial/deserial converter 120 operate in response to a clock signal CLK/a clock bar signal CLKB output from the clock signal processing unit 160.

The integrated digital logic unit 130 includes a parallel DQS generator (Parallel DQS GEN) 131, a parallel WCK generator (Parallel WCK GEN) 132, and a parallel DQS check unit (Parallel DQS CHECKER) 133.

The integrated digital logic unit 130 generates the data strobe signal DQS output, the data clock signal WCK output, and a DQS driver enable signal DRE-I in response to the DQS generation control signal DQS GEN CTRL and the WCK generation control signal WCK GEN CTRL, and distributes and outputs the generated signals to four channels. The integrated digital logic unit 130 compares the received data strobe signal Received DQS received from the multi-channel receiver 150 with the expected data strobe signal Expected DQS stored therein in response to the DQS check control signal DQS CHK CTRL, and generates a comparison result CHK Result DQS.

With reference to FIG. 2, connection relationships and functions of the Parallel DQS GEN 131, the Parallel WCK GEN 132, and the Parallel DQS CHECKER 133 are described in detail below.

The Parallel DQS GEN 131 generates the data strobe signal DQS output in parallel form including Preamble, Burst, and Postamble in response to the DQS generation control signal DQS GEN CTRL that is in parallel form and received from the serial/deserial converter 120, and generates the DQS driver enable signal DRE-I in response to a DQS driver enable signal (not illustrated) included in the DQS generation control signal DQS GEN CTRL.

The DQS driver enable signal DRE-I is activated when the data strobe signal DQS output is transmitted to the DUT 20. As will be described below, when the multi-channel receiver 150 receives the received data strobe signal Received DQS from the DUT 20, the DQS driver enable signal DRE-I is deactivated, so that the function of the multi-channel transmitter 140 is stopped.

The Parallel WCK GEN 132 generates the data clock signal WCK output in parallel form including Preamble1, Preamble2, and Toggle in response to the WCK generation control signal WCK GEN CTRL that is in parallel form and received from the serial/deserial converter 120.

The Parallel DQS CHECKER 133 compares the received data strobe signal Received DQS with the expected data Expected DQS in response to the DQS check control signal DQS CHK CTRL received from the ATE 10, and transmits the check result signals CHK Result DQS0/1, which are comparison results, to the ATE 10 via the serial/deserial converter 120 and the buffer unit 110.

The data strobe signal DQS output and the DQS driver enable signal DRE-I generated by the Parallel DQS GEN 131 and the data clock signal WCK output generated by the Parallel WCK GEN 132 are transmitted to and processed by the multi-channel transmitter 140. Accordingly, four sets of the 16-bit data strobe signal DQS output in parallel form, four sets of the 16-bit data clock signal WCK output in parallel form, and four sets of the 16-bit DQS driver enable signal DRE-I in parallel form, that is, three 64-bit signals are each distributed and output to the four channels. Furthermore, since two sets of a 16-bit parallel signal are output from the multi-channel receiver 150, the check result signal CHK Result DQS is separated into the first and second check result signals CHK Result DQS0 and CHK Result DQS1 respectively corresponding to two channels, and the first and second check result signals CHK Result DQS0 and CHK Result DQS1 are transmitted to the ATE 10.

The multi-channel transmitter 140 includes four channels 141 to 144 through which the data strobe signal DQS output and the data clock signal WCK output are transmitted to the DUT 20. Particularly, the data strobe signal DQS output is transmitted to the DUT 20 when the DQS driver enable signal DRE-I is activated.

For convenience of description, a configuration and an operation of one of the four channels 141 to 144 are described, but the configuration and the operation are applied to each of the other three sub-channels.

Figure 6:
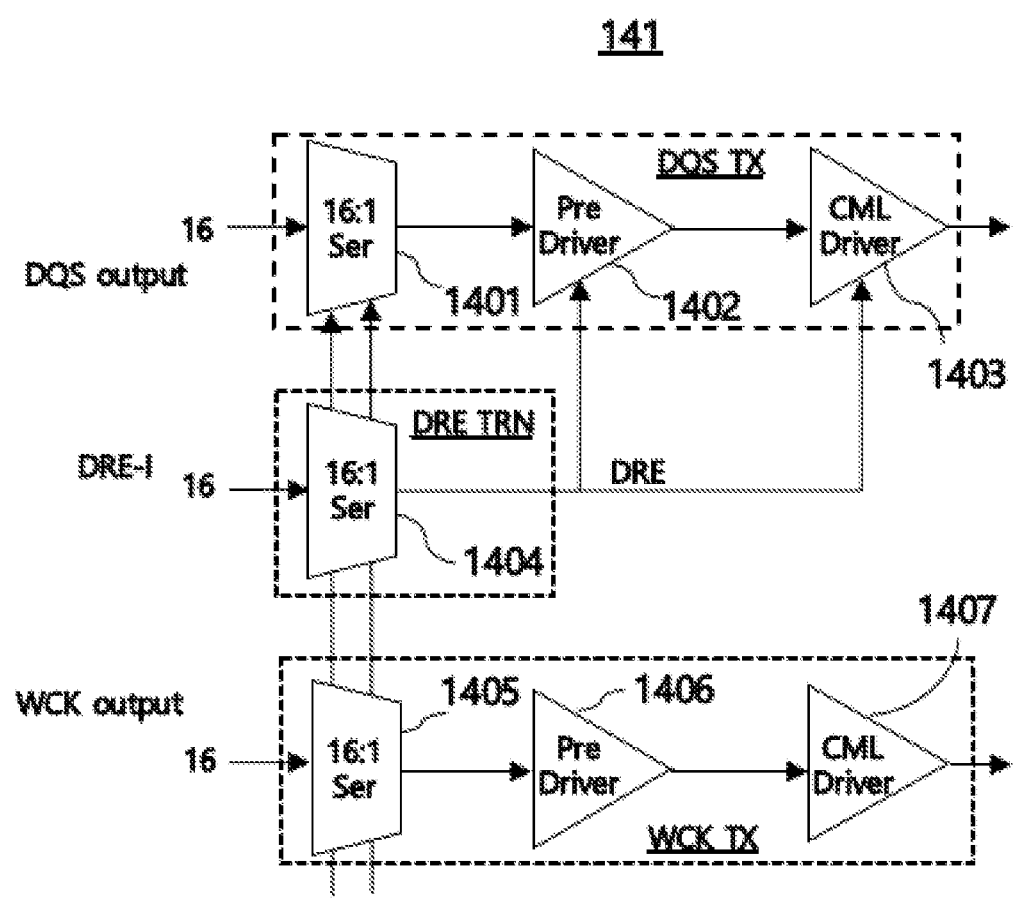
FIG. 6 illustrates a channel of FIG. 5 according to an embodiment of the present disclosure.

FIG. 6 illustrates a channel of FIG. 5 according to an embodiment of the present disclosure. Referring to FIG. 6, the first channel (CH #1) 141 includes a data strobe signal transmitter DQS TX, a data clock signal transmitter WCK TX, and a DQS enable signal converter DRE TRN. The data clock signal transmitter WCK TX converts the 16-bit data clock signal WCK output in parallel form received from the Parallel WCK GEN 132 into a signal in serial form and outputs the converted signal to the DUT 20. The DQS enable signal converter DRE TRN converts the 16-bit DQS driver enable signal DRE-I in parallel form received from the Parallel DQS GEN 131 into a transmission enable signal DRE in serial form. The data strobe signal transmitter DQS TX converts the 16-bit data strobe signal DQS output in parallel form received from the Parallel DQS GEN 131 into a signal in serial form according to the transmission enable signal DRE and outputs the converted signal to the DUT 20.

With reference to FIG. 6, functions of the DQS TX, the WCK TX, and the DRE TRN are described in detail below.

The DRE TRN may be implemented as a fourth serializer (16:1 Ser) 1404 that generates the transmission enable signal DRE in serial form based on the 16-bit DQS driver enable signal DRE-I in parallel form.

The DQS TX includes a third serializer (16:1 Ser) 1401, a first pre-driver (Pre Driver) 1402, and a first current mode logic driver (CML Driver) 1403, converts the 16-bit data strobe signal DQS output in parallel form received from the integrated digital logic unit 130 into a signal in serial form in response to the transmission enable signal DRE, and transmits the converted signal to the DUT 20.

The 16:1 Ser 1401 serially converts the 16-bit data strobe signal DQS output in parallel form. In the process of serially converting the 16-bit data strobe signal DQS output in parallel form, the core idea of the present disclosure is to make a transmission rate of the 16-bit data strobe signal DQS output in the 16:1 Ser 1401 higher than the data transmission rate of the ATE 10 and to synchronize phases of signals of the four channels, which will be described below.

The Pre Driver 1402 primarily drives the 16-bit data strobe signal DQS output in serial form, which is output from the 16:1 Ser 1401, in response to the transmission enable signal DRE. The transmission enable signal DRE is activated only when the DQS generation control signal DQS GEN CTRL is valid, that is, only when the data strobe signal DQS output is transmitted to the DUT 20, and is deactivated when the TAU 100 receives the received data strobe signal Received DQS from the DUT 20.

The CML Driver 1403 converts the 16-bit data strobe signal DQS output in serial form, which is output from the first pre-driver 1402, into a current mode output signal, and transmits the current mode output signal to the DUT 20. In an embodiment, the operation of the CML Driver 1403 may be determined according to the transmission enable signal DRE.

The WCK TX includes a fifth serializer (16:1 Ser) 1405, a second pre-driver (Pre Driver) 1406, and a second current mode logic driver (CML Driver) 1407, and converts the 16-bit data clock signal WCK output in parallel form received from the integrated digital logic unit 130 into a signal in serial form, and transmits the converted signal to the DUT 20.

The 16:1 Ser 1405 converts the 16-bit data clock signal WCK output in parallel form into the signal in serial form. In the process of converting the parallel data clock signal into the serial data clock signal, a transmission rate of the data clock signal WCK output converted by the 16:1 Ser 1405 becomes higher than the data processing rate of the ATE 10 as in the 16:1 Ser 1401.

The Pre Driver 1406 primarily drives the 16-bit data clock signal WCK output in serial form, which is output from the 16:1 Ser 1405.

The CML Driver 1407 converts the 16-bit data clock signal WCK output in serial form, which is output from the Pre Driver 1406, into a current mode output signal, and transmits the current mode output signal to the DUT 20.

In each of the data strobe signal DQS output and the data clock signal WCK output, which are output from the four channels 141 to 144, outputs of two of the four channels are tied into one, and thus two outputs from the four channels are transmitted to two DQS pins DQS0_t/c and DQS1_t/c and two WCK pins WCK0_t/c and WCK1_t/c of the DUT 20, respectively, by two bits.

The phases of the signals transmitted by the four channels need to be synchronized with one another. When the phases are not synchronized with one another, it affects eye-opening in the memory that is the DUT 20. In the present disclosure, in consideration of this point, phases of sampling clocks used in the serializers 1401, 1404, and 1405 constituting each of the four channels in the multi-channel transmitter 140 are synchronized with one another, which will be described below.

Referring to FIG. 5, the multi-channel receiver 150 includes two channels 151 and 152, and each channel includes two samplers 1511 and 1512 and a third deserializer (2:16 Des) 1513 to sample the received data strobe signal Received DQS output from the DUT 20 and transmit the sampled signal to the integrated digital logic unit 130.

The received data strobe signals Received DQS0 and Received DQS1 respectively received by two bits from the two DQS pins DQS0_t/c and DQS1_t/c are allocated to the two samplers 1511 and 1512 and sampled by the two samplers 1511 and 1512, respectively.

The 2:16 Des 1513 converts the received data strobe signals Received DQS0 and DQS1, which are sampled by and output in parallel from the two samplers 1511 and 1512, into a serial data signal, and transmits the serial data signal to the Parallel DQS CHECKER 133 in the integrated digital logic unit 130 shown in FIG. 4.

Referring to FIG. 4, the clock signal processing unit 160 includes a first buffer (BUF) 161, an all-digital phase-locked loop (ADPLL) 162, and a second buffer (BUF) 163, and adjusts, buffers, and outputs phases of the clock signal CLK/the clock bar signal CLKB received from the ATE 10 and having phases opposite to each other.

The first BUF 161 primarily buffers two clock signals, that is, the clock signal CLK/the clock bar signal CLKB. The ADPLL 162 operates in a ring-oscillator-based manner and tunes the primarily buffered two clock signals CLK/CLKB. The second BUF 163 secondarily buffers the two clock signals CLK/CLKB tuned by the ADPLL 162.

Referring to FIG. 5, the DIV 1701 and the DIV 1702 each up to ⅛-divide each of the two tuned clock signals CLK/CLKB, which are output from the two phase interpolators 1801 and 1802, by using three reset signals RST0 to RST2. A specific circuit thereof is described below.

Each of the two phase interpolators 1801 and 1802 includes a phase interpolator (PI) and a duty cycle corrector (DCC) having a function of tuning the two clock signals CLK/CLKB, which are output from the clock signal processing unit 160, by weighting them at a predetermined ratio and averaging them. In an embodiment, since a data signal DQ and a data strobe signal DQS need to have a phase difference of 90°, a phase of the data strobe signal DQS is adjusted using the phase interpolator PI.

In an embodiment of the present disclosure, when the data strobe signal DQS output and the data clock signal WCK output are transmitted to the DUT 20, they are transmitted at a high rate according to an operating frequency of the DUT 20, but on the other hand, when the data strobe signal Received DQS is received from the DUT 20, its transmission rate is reduced to match an operating frequency of the ATE 10, as described above.

These functions are performed by the 16:1 Ser 1401 and the 16:1 Ser 1405 of the multi-channel transmitter 140 and the 2:16 Des 1513 of the multi-channel receiver 150.

The 16:1 Ser 1401 corresponds to the data processing rate of the ATE 10, receives the low-speed 16-bit data strobe signal DQS output in parallel from the integrated digital logic unit 130, and converts the low-speed 16-bit data strobe signal DQS output into a high-speed serial 1-bit data strobe signal corresponding to the data processing rate of the DUT 20.

The 16:1 Ser 1405 corresponds to the data processing rate of the ATE 10, receives a low-speed 16-bit data clock signal WCK output in parallel from the integrated digital logic unit 130, and converts the low-speed 16-bit data clock signal WCK output into a high-speed serial 16-bit data clock signal corresponding to the data processing rate of the DUT 20.

The 2:16 Des 1513 converts the high-speed 16-bit received data strobe signal Received DQS into a low-speed serial 16-bit received data strobe signal Received DQS. Accordingly, it is possible to solve an imbalance in processing rate between the ATE 10 and the DUT 20.

The 16:1 Ser 1401, the 16:1 Ser 1405, and the 2:16 Des 1513 described above can be implemented in various ways. In an embodiment, a combination of a plurality of 2:1 serializers is proposed to implement the 16:1 Ser 1401, the 16:1 Ser 1405, and the 2:16 Des 1513, which will be described below.

Figure 7:
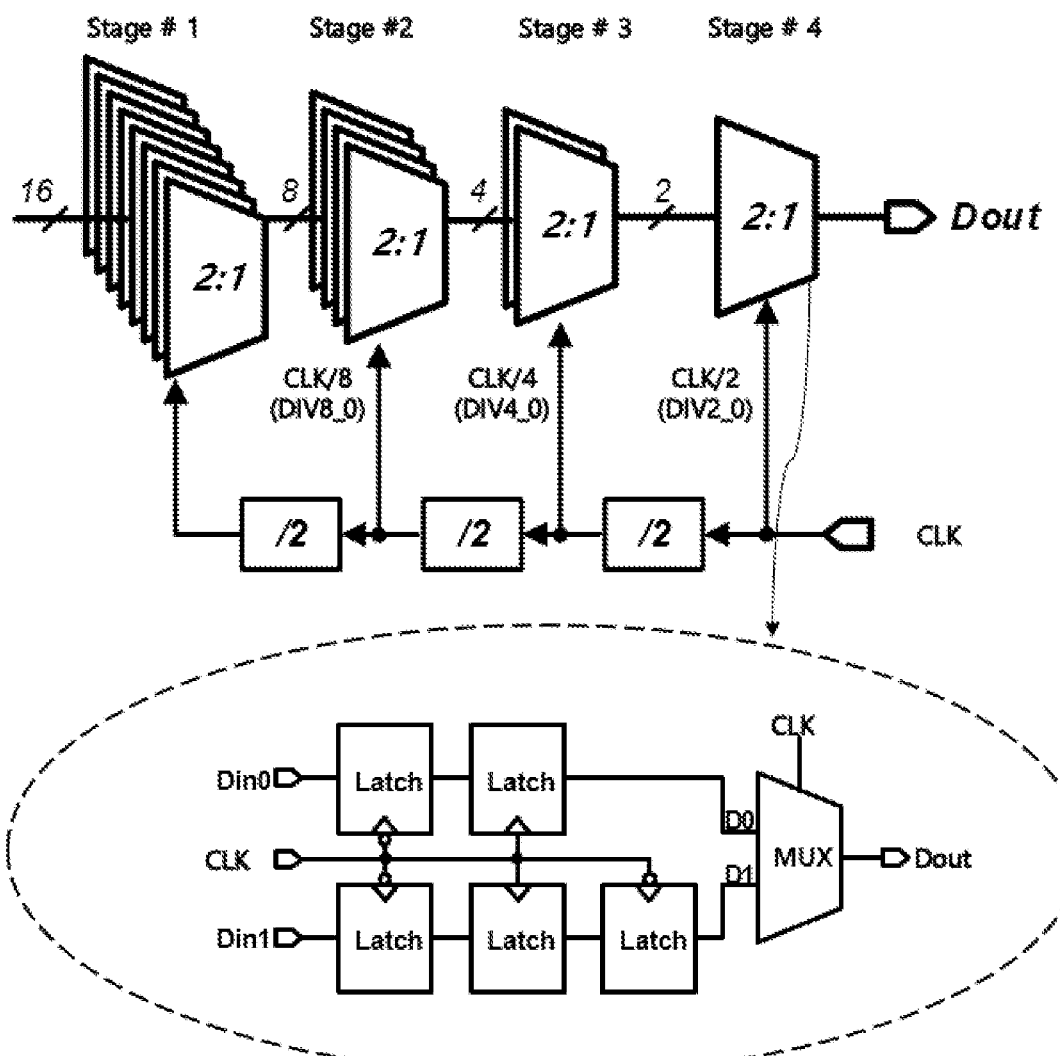
FIG. 7 illustrates a serializer according to an embodiment of the present disclosure.

FIG. 7 illustrates a serializer according to an embodiment of the present disclosure. The serializer illustrated in FIG. 7 can be used as the 16:1 Ser 1405 even though FIG. 7 shows the 16:1 Ser 1401.

Referring to FIG. 7, the 16:1 Ser 1401 and the 16:1 Ser 1405 each can be implemented using a plurality of 2:1 serializers. For example, when implemented with 4 stages Stage #1 to Stage #4, 16-bit parallel data input to the first stage Stage #1 is converted into 16-bit data in serial form while proceeding to the fourth stage Stage #4. In such a case, it can be seen that the numbers of 2:1 serializers used for the 4 stages Stage #1 to Stage #4 are 8, 4, 2, and 1, respectively, toward the fourth stage Stage #4 from the first stage Stage #1.

In FIG. 7, it can be seen that the 2:1 serializer shown as an example inside the dotted ellipse includes five latch circuits Latch and one multiplexer MUX.

A cycle of a sampling clock signal CLK that controls an operation of a 2:1 serializer included in each stage doubles toward the fourth stage Stage #4 from the first stage Stage #1, which will be described with reference to FIG. 8.

Figure 8:
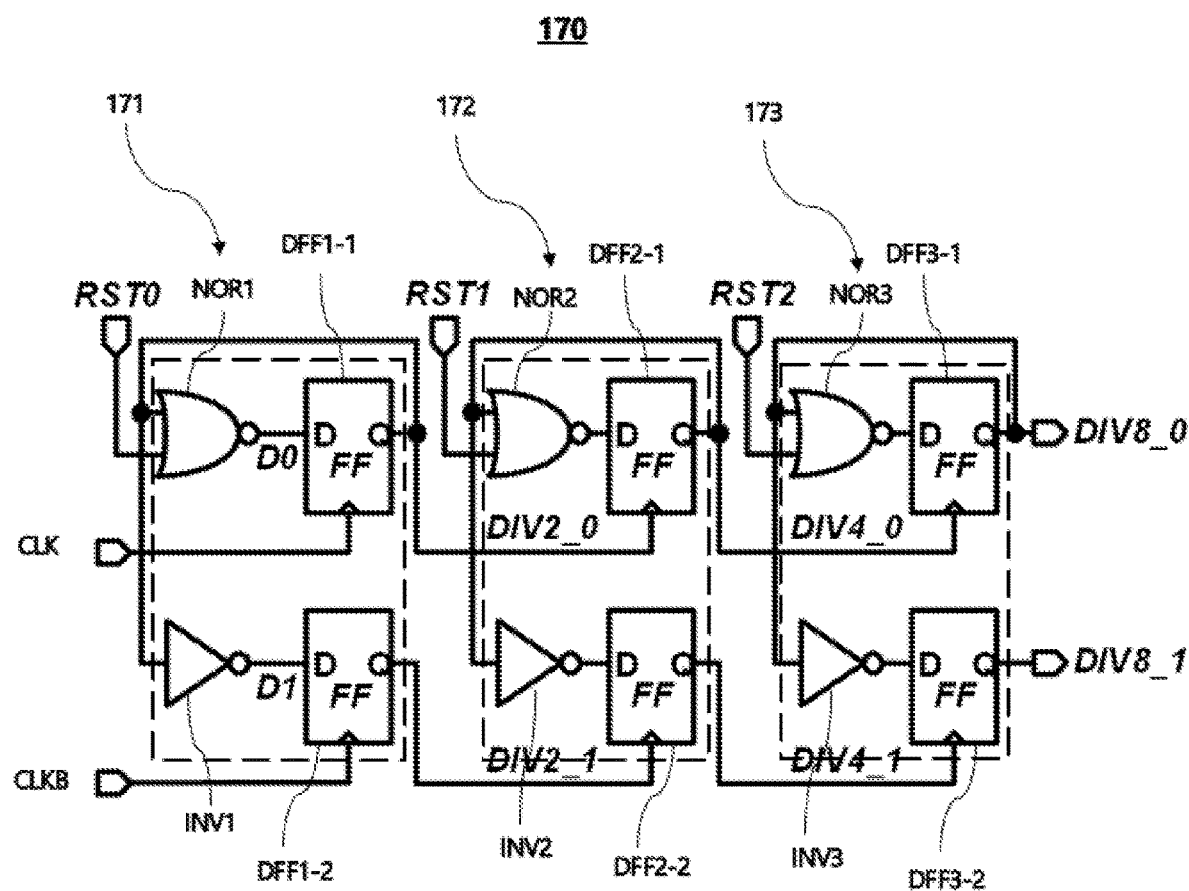
FIG. 8 illustrates a clock signal divider used in a serializer according to an embodiment of the present disclosure.
Figure 9:
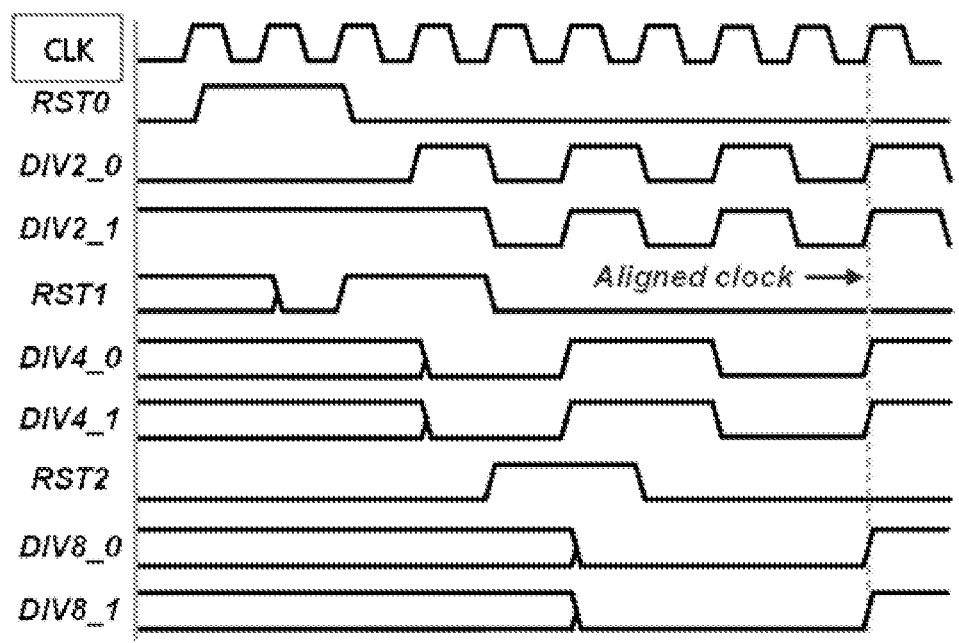
FIG. 9 illustrates an operation of a clock signal divider according to an embodiment of the present disclosure.

FIG. 8 illustrates a clock signal divider 170 for generating a divided clock, and FIG. 9 is an operation timing diagram thereof. In an embodiment, the clock signal divider 170 may be used in the serializer illustrated in FIG. 7. In another embodiment, the clock signal divider 170 may be also used to implement each of the first and the second clock signal dividers 1701 and 1702 shown in FIG. 5.

Referring to FIG. 8, the clock signal divider 170 includes three divider circuits 171 to 173, and each of the three divider circuits 171 to 173 generates two output signals in response to a corresponding one of three reset signals RST0 to RST2, and the two output signals are used as clock signals for the divider circuit at the next stage.

Each of the three divider circuits 171 to 173 feeds back one of the two output signals to an input terminal thereof, so that phases of the two output signals are synchronized with each other after a certain number of clock cycles pass.

That is, referring to FIGS. 8 and 9, the first divider circuit 171 generates two output signals DIV2_0 and DIV2_1 in response to the first reset signal RST0, a reference clock signal CLK, and a reference clock bar signal CLKB, the second divider circuit 172 generates two output signals DIV4_0 and DIV4_1 in response to the second reset signal RST1 and the two output signals DIV2_0 and DIV2_1 generated by the first divider circuit 171, and the third divider circuit 173 generates two output signals DIV8_0 and DIV8_1 in response to the third reset signal RST2 and the two output signals DIV4_0 and DIV4_1 generated by the second divider circuit 172.

Since a circuit for generating the three reset signals RST0 to RST2 associated with the reference clock signal CLK as illustrated in FIG. 9 can be easily implemented by those skilled in the art, a detailed description thereof is omitted.

Referring to FIG. 9, it can be seen that by finely tuning the phase of the reference clock signal CLK, the phases of all the output signals output from the three divider circuits 171 to 173 are synchronized with each other at a certain time indicated by a vertical dotted line.

Hereinafter, operations of the divider circuits 171 to 173 illustrated in FIG. 8 will be described. A configuration and an operation of the first divider circuit 171 are the same as those of each of the other divider circuits 172 and 173.

Figure 10:
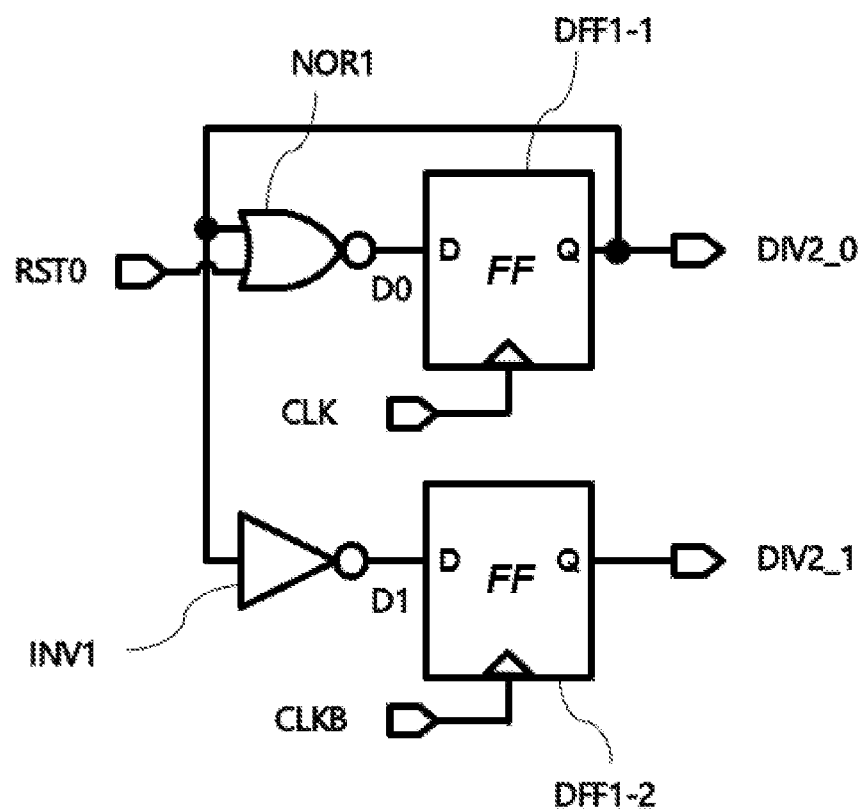
FIG. 10 illustrates a first divider circuit illustrated in FIG. 8 according to an embodiment of the present disclosure.
Figure 11:
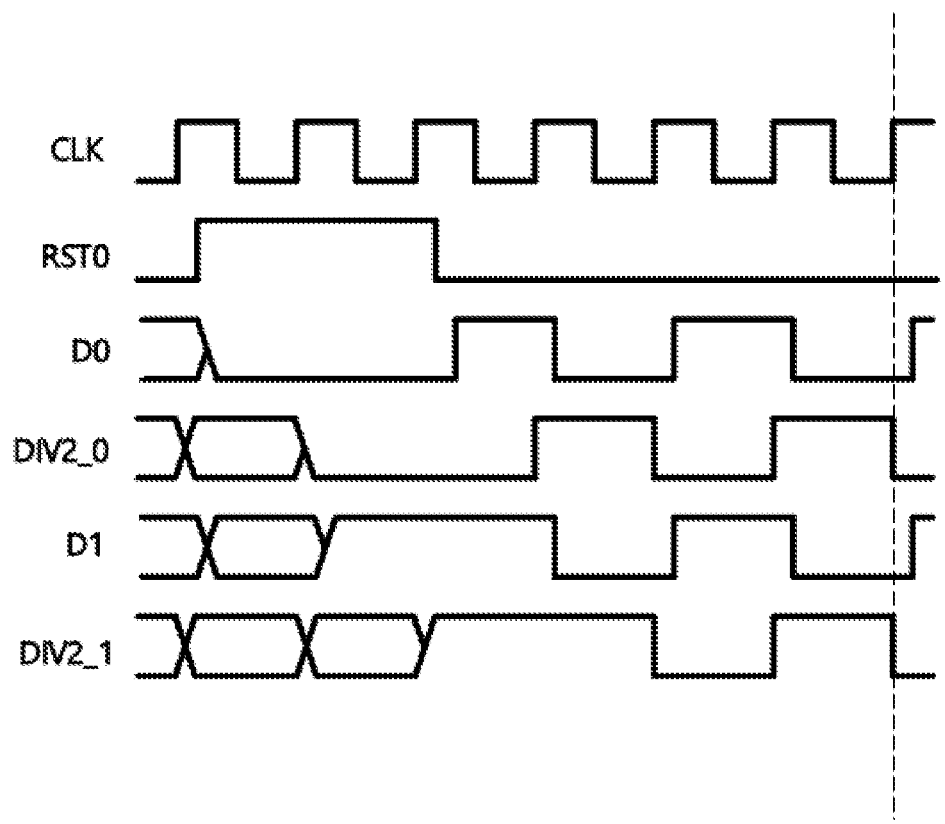
FIG. 11 is a waveform diagram describing an operation of the first divider circuit of FIG. 10.

FIG. 10 illustrates the first divider circuit 171 of FIG. 8 according to an embodiment of the present disclosure, and FIG. 11 illustrates a waveform diagram describing the operation of the first divider circuit 171 shown in FIG. 10.

Referring to FIG. 10, the first divider circuit 171 includes a NOR gate NOR1, an inverter INV1, and two D flip-flops DFF1-1 and DFF1-2.

The first reset signal RST0 is applied to one input terminal of the NOR gate NOR1 and a 1-$1^{st}$ output clock signal DIV2_0 output from the first divider circuit 171 is applied to the other input terminal of the NOR gate NOR1. The inverter INV1 inverts a phase of the 1-$1^{st}$ output clock signal DIV2_0 of the first divider circuit 171. The first D flip-flop DFF1-1 generates the 1-$1^{st}$ output clock signal DIV2_0 by delaying an output signal D0 of the NOR gate NOR1 by one cycle of the reference clock signal CLK. The second D flip-flop DFF1-2 generates a 1-$2^{nd}$ output clock signal DIV2_1 by delaying an output signal D1 of the inverter INV1 by one cycle of the reference clock bar signal CLKB.

Referring to FIGS. 10 and 11, the 1-$1^{st}$ output clock signal DIV2_0 is fed back as an input signal, so that the phases of the two output clock signals DIV2_0 and DIV2_1 are synchronized with each other after a certain number of cycles of the clock signal CLK pass. The synchronization is indicated by a vertical dotted line in FIG. 11.

By connecting three divider circuits as shown in FIG. 8, the six output clock signals DIV2_0, DIV2_1, DIV4_0, DIV4_1, DIV8_0, and DIV8_1 are synchronized with the reference clock signal CLK as illustrated in FIG. 9.

Referring to FIG. 8, the clock signal dividers 171 to 173 generate a ½ divided clock signal DIV2, a ¼ divided clock signal DIV4, and a ⅛ divided clock signal DIV8, respectively, by using the three reset signals RST0 to RST2, the clock signal CLK, and the clock bar signal CLKB, and can be implemented with the six D flip-flops DFF1-1, DFF1-2, DFF2-1, DFF2-2, DFF3-1, and DFF3-2, the three NOR gates NOR1 to NOR3, and the three inverters INV1 to INV3.

The present disclosure proposes using the clock signal dividers 171 to 173 in order to synchronize phases of clock signals used in each channel, and thus the clock signal CLK and the clock bar signal CLKB described in FIGS. 8 and 10 will be DQS0_CLK, DQS1_CLK, WCK0_CLK, and WCK1_CLK used to transmit the data strobe signal DQS output and the data clock signal WCK output.

Since operations of the flip-flop, the NOR gate, and the inverter are well known and thus can be easily understood by those skilled in the art, the operation of the logic circuit illustrated in FIG. 8 is not described in detail. However, in order to synchronize the signals generated in each channel by using the circuit of FIG. 8, the first reset signal RST0 is applied to one input terminal of the NOR gate NOR1 and the output clock signal DIV2_0 of the D flip-flop DFF1-1 is commonly fed back to the other input terminal of the NOR gate NOR1 and an input terminal of the inverter INV1, so that a delay time of the DQS generation control signal DQS GEN CTRL and a delay time of the data strobe signal DQS output are made constant by using the first reset signal RST0, and the output clock signals DIV2_0 and DIV2_1 of the D flip-flops DFF1-1 and DFF1-2 are synchronized with each other by using the fed-back output clock signal DVI2_0 of the D flip-flop DFF1-1.

The above description is applied to the functions of the second and third reset signals RST1 and RST2 sequentially applied to the NOR gate NOR2 and the NOR gate NOR3, the fed-back output clock signal DIV4_0 of the D flip-flop DFF2-1, and the fed-back output clock signal DIV8_0 of the D flip-flop DFF3-1.

A phase difference between the channels 141 to 144 or a phase difference between the channels 151 and 152 becomes a factor that interferes with a normal operation of the DUT 20 operating using data received from each channel. Therefore, the present disclosure proposes preventing the occurrence of a phase difference between channels by synchronizing phases of sampling clocks used by serializers and deserializers that are included in each of the channels 140 and 150.

Although the technical spirit of the present disclosure has been described together with the accompanying drawings, this is an illustrative example of a preferred embodiment of the present disclosure, but does not limit the present disclosure. In addition, it is clear that various modifications and imitations can be made by anyone skilled in the art to which the present disclosure belongs without departing from the scope of the technical spirit of the present disclosure.

What is claimed is:

1. A test aid unit comprising:
a clock signal divider configured to generate a ½ divided clock signal, a ¼ divided clock signal, and a ⅛ divided clock signal, which are synchronized with a reference clock signal, by using a plurality of reset signals, the reference clock signal, and a reference clock bar signal having a phase opposite to that of the reference clock signal;
an integrated digital logic circuit configured to operate in response to a plurality of test control signals received from automatic test equipment, and to generate a driver enable signal, a data strobe signal, a data clock signal, and a check result signal;
a multi-channel transmitter configured to convert transmission rates of the data strobe signal and the data clock signal in parallel form into a transmission rate corresponding to a data processing rate of a device under test in response to the reference clock signal, the ½ divided clock signal, the ¼ divided clock signal, and the ⅛ divided clock signal, and to transmit the converted signals to the device under test; and
a multi-channel receiver configured to convert received data signals in serial form received from the device under test into parallel data in response to the reference clock signal, the ½ divided clock signal, the ¼ divided clock signal, and the ⅛ divided clock signal, and to transmit the parallel data to the integrated digital logic unit,
wherein cycles of the ½ divided clock signal, the ¼ divided clock signal, and the ⅛ divided clock signal are ½ times, ¼ times, and ⅛ times a cycle of the reference clock signal, respectively.

2. The test aid unit of claim 1, further comprising:
a serial/deserial converter including:
a plurality of deserializers configured to convert the plurality of test control signals in serial form output from the automatic test equipment into a plurality of test control signals in parallel form, and to transmit the converted test control signals to the integrated digital logic unit, and
a plurality of serializers configured to convert the check result signal in parallel form output from the integrated digital logic unit into a check result signal in parallel form, and to transmit the converted check result signal to the automatic test equipment.

3. The test aid unit of claim 2, wherein the plurality of test control signals include a DQS (data strobe signal) generation control signal, a WCK (data clock signal) generation control signal, and a DQS check control signal, and
wherein the integrated digital logic unit comprises:
a parallel DQS generator configured to generate the driver enable signal for determining whether to transmit the data strobe signal including first preamble, burst, and postamble signals to the device under test in response to the DQS generation control signal;
a parallel WCK generator configured to generate the data clock signal including first preamble, second preamble, and toggle signals in response to the WCK generation control signal; and
a DQS check circuit configured to generate the check result signal including result information obtained by comparing the received data signal with an expected data signal stored in advance, in response to the DQS check control signal.

4. The test aid unit of claim 2, wherein the multi-channel transmitter comprises:
an enable signal converter configured to convert the driver enable signal in parallel form into a transmission enable signal in serial form;
a data strobe transmitter configured to convert the data strobe signal in parallel form into a data strobe signal in serial form in response to the transmission enable signal; and
a data clock transmitter configured to convert the data clock signal in parallel form into a data clock signal in serial form.

5. The test aid unit of claim 4, wherein the enable signal converter comprises:
a first serializer configured to convert the driver enable signal in parallel form into the transmission enable signal in serial form, and
wherein the data strobe transmitter comprises:
a second serializer configured to convert the data strobe signal in parallel form into the data strobe signal in serial form; and
a first current mode logic driver configured to convert an output of the second serializer into a first current mode output signal in response to the transmission enable signal,
wherein the data clock transmitter comprises:
a third serializer configured to convert the data clock signal in parallel form into the data clock signal in serial form; and
a second current mode logic driver configured to convert an output of the third serializer into a second current mode output signal, and
wherein the first serializer to the third serializer use the reference clock signal, the ½ divided clock signal, the ¼ divided clock signal, and the ⅛ divided clock signal so that a transmission rate of converted signals in serial form corresponds to the data processing rate of the device under test.

6. The test aid unit of claim 5, wherein the data strobe transmitter further comprises:
a first pre-driver configured to improve driving capability of the output of the second serializer and to transmit an output having improved driving capability to the first current mode logic driver; and
a second pre-driver configured to improve driving capability of the output of the third serializer and to transmit an output having improved driving capability to the second current mode logic driver.

7. The test aid unit of claim 6, wherein the first pre-driver operates in response to the transmission enable signal.

8. The test aid unit of claim 5, wherein the driver enable signal, the data strobe signal, and the data clock signal include each 16-bit data in serial form.

9. The test aid unit of claim 8, wherein each of the first serializer to the third serializer comprises:
a first stage configured to convert 16-bit data to 8-bit serial data by using eight 2:1 serializers;
a second stage configured to convert the 8-bit serial data output from the first stage into 4-bit serial data by using four 2:1 serializers;
a third stage configured to convert the 4-bit serial data output from the second stage into 2-bit serial data by using two 2:1 serializers; and
a fourth stage configured to convert the 2-bit serial data output from the third stage into 1-bit serial data by using one 2:1 serializer,
wherein the 2:1 serializer receives two data in parallel and converts the received two data into two serial data, and
wherein the first stage to the fourth stage operate in response to the ⅛ divided clock signal, the ¼ divided clock signal, the ½ divided clock signal, and the reference clock signal, respectively.

10. The test aid unit of claim 2, wherein the multi-channel receiver comprises:
a first sampler configured to sample one of the received data signals output from the device under test;
a second sampler configured to sample another one of the received data signals output from the device under test; and
a first deserializer configured to convert a 1-bit received data signal output from each of the first sampler and the second sampler into a 16-bit data signal in serial form, and to transmit the 16-bit data signal to the integrated digital logic unit,
wherein the first sampler, the second sampler, and the first deserializer operate by using at least one of the reference clock signal, the ½ divided clock signal, the ¼ divided clock signal, and the ⅛ divided clock signal.

11. The test aid unit of claim 2, further comprising:
a phase interpolator configured to generate the reference clock signal and the reference clock bar signal by giving weights to a clock signal and a clock bar signal at a predetermined ratio and taking an average thereof, the clock signal and the clock bar signal being provided by an external device, the clock bar signal having a phase opposite to that of the clock signal.

12. The test aid unit of claim 2, wherein the clock signal divider comprises:
a first clock signal divider for transmission configured to generate a ½ divided clock signal, a ¼ divided clock signal, and a ⅛ divided clock signal, which are synchronized with the reference clock signal, by using the plurality of reset signals, the reference clock signal, and the reference clock bar signal; and a second clock signal divider for reception configured to generate a ½ divided clock signal, a ¼ divided clock signal, and a ⅛ divided clock signal, which are synchronized with the reference clock signal, by using the plurality of reset signals, the reference clock signal, and the reference clock bar signal,
wherein the reference clock signal, the ½ divided clock signal, the ¼ divided clock signal, and the ⅛ divided clock signal output from the first clock signal divider for transmission are used to drive the multi-channel transmitter, and
wherein the reference clock signal, the ½ divided clock signal, the ¼ divided clock signal, and the ⅛ divided clock signal output from the second clock signal divider for reception are used to drive the multi-channel receiver.

13. The test aid unit of claim 2, wherein the clock signal divider comprises:
a first divider circuit configured to generate two ½ divided clock signals having the same phase in response to a first reset signal, which is one of the plurality of reset signals, the reference clock signal, and the reference clock bar signal;
a second divider circuit configured to generate two ¼ divided clock signals having the same phase in response to a second reset signal, which is one of the plurality of reset signals, and the two ½ divided clock signals; and
a third divider circuit configured to generate two ⅛ divided clock signals having the same phase in response to a third reset signal, which is one of the plurality of reset signals, and the two ¼ divided clock signals.

14. The test aid unit of claim 13, wherein the first divider circuit comprises:
a first NOR gate including a first input terminal to which the first reset signal is applied and a second input terminal to which a first one of the two ½ divided clock signals is applied;
a 1-1$^{st}$ D flip-flop configured to generate the first one of the two ½ divided clock signals by delaying an output signal of the first NOR gate by one cycle of the reference clock signal;
a first inverter configured to invert a phase of the first one of the two ½ divided clock signals; and
a 1-2$^{nd}$ D flip-flop configured to generate a second one of the two ½ divided clock signals by delaying an output signal of the first inverter by one cycle of the reference clock bar signal,
wherein the second divider circuit comprises:
a second NOR gate including a first input terminal to which the second reset signal is applied and a second input terminal to which a first one of the two ¼ divided clock signals is applied;
a 2-1$^{st}$ D flip-flop configured to generate the first one of the two ¼ divided clock signals by delaying an output signal of the second NOR gate by one cycle of the first one of the two ½ divided clock signals;
a second inverter configured to invert a phase of the first one of the two ¼ divided clock signals; and
a 2-2$^{nd}$ D flip-flop configured to generate a second one of the two ¼ divided clock signals by delaying an output signal of the second inverter by one cycle of the second one of the two ½ divided clock signals, and
wherein the third divider circuit comprises:

a third NOR gate including a first input terminal to which the third reset signal is applied and a second input terminal to which a first one of the two ⅛ divided clock signals is applied;

a 3-$1^{st}$ D flip-flop configured to generate the first one of the two ⅛ divided clock signals by delaying an output signal of the third NOR gate by one cycle of the first one of the ¼ divided clock signals;

a third inverter configured to invert a phase of the first one of the two ⅛ divided clock signals; and a 3-$2^{nd}$ D flip-flop configured to generate a second one of the two ⅛ divided clock signals by delaying an output signal of the third inverter by one cycle of the second one of the two ¼ divided clock signals.

15. The test aid unit of claim 14, further comprising:

a plurality of transmission buffers configured to buffer the plurality of test control signals output from the automatic test equipment, and to transmit buffered test control signals to the plurality of deserializers; and a buffer unit including a plurality of receiving buffers configured to buffer the check result signal output from the integrated digital logic unit and to transmit a buffered check result signal to the automatic test equipment.

16. The test aid unit of claim 1, wherein the device under test is either low-power DDR (LPDDR) or LPDDR5.

17. The test aid unit of claim 1, wherein the test aid unit operates in a state physically separated from the automatic test equipment and the device under test.

* * * * *